(12) United States Patent
Ilkorur et al.

(10) Patent No.: US 12,464,295 B2
(45) Date of Patent: Nov. 4, 2025

(54) AIR MOTION TRANSFORMER TRANSDUCER WITH CLOSED-CIRCUIT MAGNET MOTOR SYSTEM

(71) Applicant: Apple Inc., Cupertino, CA (US)

(72) Inventors: Onur I. Ilkorur, Santa Clara, CA (US); Christopher Wilk, Los Gatos, CA (US); Martial A. Rousseau, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 18/420,439

(22) Filed: Jan. 23, 2024

(65) Prior Publication Data

US 2024/0292157 A1    Aug. 29, 2024

Related U.S. Application Data

(60) Provisional application No. 63/486,608, filed on Feb. 23, 2023.

(51) Int. Cl.
*H04R 23/00* (2006.01)
*H05K 5/00* (2006.01)

(52) U.S. Cl.
CPC .......... *H04R 23/00* (2013.01); *H05K 5/0086* (2013.01); *H04R 2499/11* (2013.01)

(58) Field of Classification Search
CPC .... H04R 23/00; H04R 2499/11; H04R 9/025; H04R 9/046; H04R 9/06; H04R 9/045; H04R 9/048; H05K 5/0086; H05K 5/0217; H01F 27/24; H01F 27/02
See application file for complete search history.

(56) References Cited

U.S. PATENT DOCUMENTS 10,595,108 B2    3/2020  Kim et al.
11,178,490 B2   11/2021  Heinz

FOREIGN PATENT DOCUMENTS

| DE | 202007016414 U1 | 4/2008 |
| DE | 102012000499 A1 | 12/2012 |
| GB | 2621479 A | 2/2024 |
| WO | 17019434 A1 | 2/2017 |

*Primary Examiner* — Tuan D Nguyen
(74) *Attorney, Agent, or Firm* — Aikin & Gallant, LLP

(57) ABSTRACT

A transducer assembly comprising: an air motion transformer having a magnet assembly operable to provide a magnetic field and a folded diaphragm having conductive traces and operable to expand or contract in a first direction and emit a sound in a second direction perpendicular to the first direction; and a ferromagnetic assembly comprising a number of fixed members arranged within folds of the folded diaphragm to provide a closed loop magnetic circuit that drives the expansion or contraction of the folded diaphragm.

20 Claims, 8 Drawing Sheets

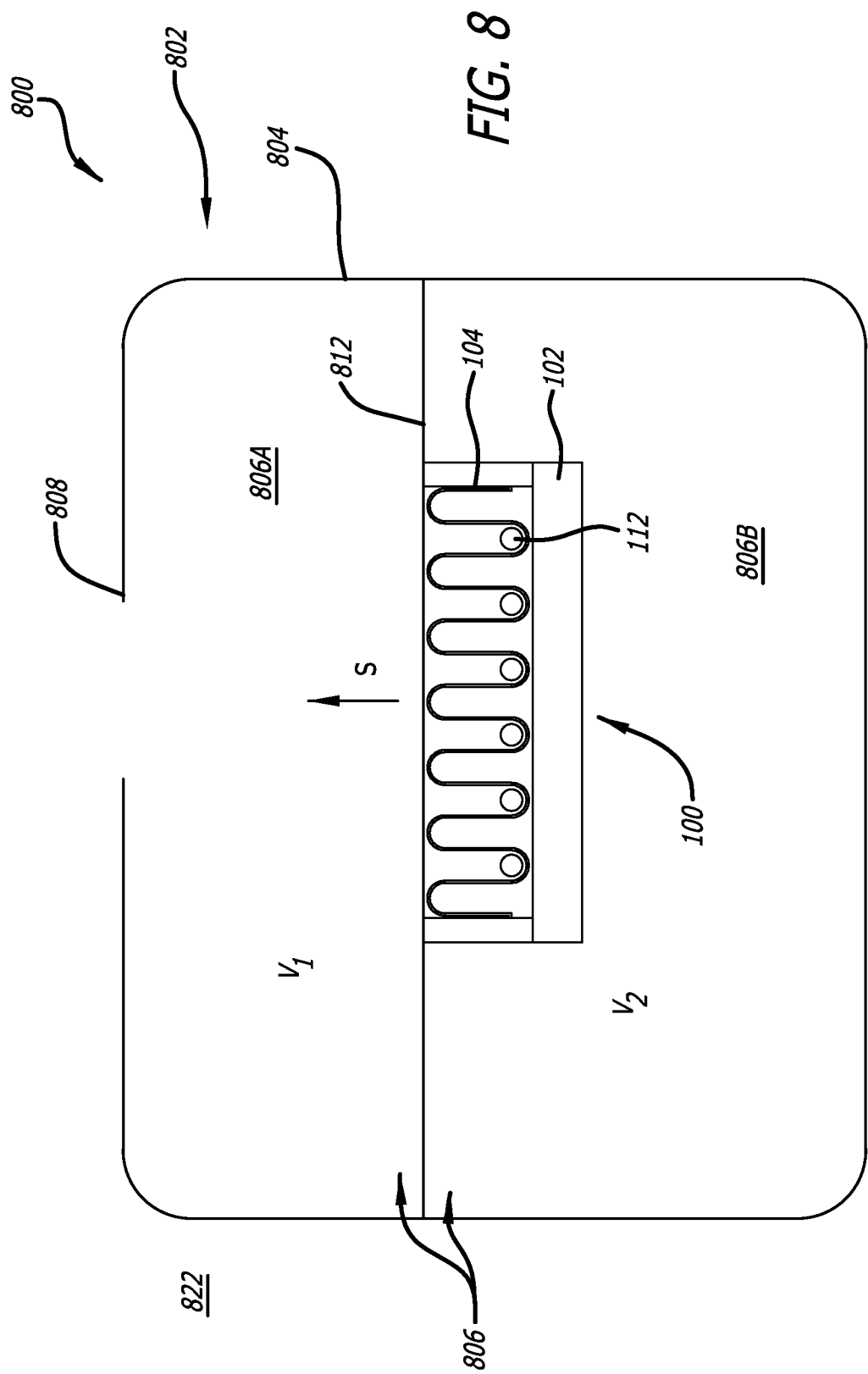

AIR MOTION TRANSFORMER TRANSDUCER WITH CLOSED-CIRCUIT MAGNET MOTOR SYSTEM

RELATED APPLICATIONS

This application claims the benefit of priority of U.S. Provisional Application No. 63/486,608, filed Feb. 23, 2023, which is herein incorporated by reference.

FIELD

An aspect of the disclosure is directed to a transducer assembly having an air motion transformer, and more particularly a transducer assembly having an air motion transformer with a closed-circuit magnet motor system. Other aspects are also described and claimed.

BACKGROUND

Portable devices (e.g., portable speakers, smart phones, earphones, earbuds, etc.) have within them one or more transducers that convert an input electrical audio signal into a sound pressure wave output that can be heard by the user, or a sound pressure wave input into an electrical audio signal. The transducer (e.g., a speaker) can be used to, for example, output sound pressure waves corresponding to sounds associated with a game or music the user wishes to play, or output sound pressure waves corresponding to the voice of a far end user, such as during a telephone call. In some aspects, where the transducer may be an electroacoustic or electromagnetic driver such as an air motion transformer transducer. An air motion transformer (AMT) transducer produces sound using a pleated or folded diaphragm that moves like an accordion in a magnetic field produced by a magnet motor system to output sound. The magnet motor system of an AMT transducer, however, produces an open loop magnetic circuit in which the flux lines are not guided between poles of the magnets. Open loop magnetic circuits may be relatively inefficient, however, because the diaphragm is positioned within a stray magnetic field and there is no magnetic flux concentration around the conductors (e.g., wires) embedded within the diaphragm to increase the Lorentz Force Coupling.

SUMMARY

An aspect of the disclosure is directed to a transducer assembly having an air motion transformer (AMT), and more particularly a transducer assembly having an AMT transducer with a closed loop or closed-circuit magnet motor system for improved efficiency. As previously discussed, AMT transducers typically have an open loop magnetic circuit in which the diaphragm is within a stray magnetic field. Accordingly, there is no magnetic flux concentration around the conductors to increase the Lorentz Force Coupling (e.g., efficiency=magnetic flux density (B)×conductor length (L)). In some aspects, it is contemplated that adding more length to the conductor (e.g., wires) embedded within the diaphragm could improve the Lorentz force. This solution, however, increases the moving mass of the diaphragm which, in turn, reduces the midband sensitivity of the transducer and is therefore may not be desired. The instant disclosure therefore proposes improving efficiency by instead converting the open loop circuit of the magnet motor system of the AMT transducer to a closed loop magnetic circuit which concentrates the flux lines around the conductors embedded within the diaphragm. In closed circuit magnet motors, there is a defined gap, where the magnetic flux is focused and the voice coil is placed at this rich magnetic field to increase the efficiency of the transducer (e.g., increase in B). This, in turn, eliminates the need for extra wire length within the diaphragm and improves the efficiency of the transducer. Another benefit of the proposed solution observed at high frequencies was that, when the air load in front of the corrugated diaphragm is reduced, the high frequency sensitivity may be increased.

In one aspect, the solution includes introducing arranging a ferromagnetic material within the AMT transducer assembly to create a closed loop magnetic circuit. Representatively, as previously discussed, the AMT transducer includes an AMT diaphragm made up of a folded material with conductive traces and/or wires coupled thereto. The AMT diaphragm along with the traces are positioned over the hard magnet of the magnet assembly. The ferromagnetic material may be arranged within the folds of the diaphragm to create a closed loop magnetic circuit between the hard magnet and the ferromagnetic material. Representatively, the ferromagnetic material may be metal (e.g., steel) rods, pins or the like that are positioned between the folds of the diaphragm. The metal rods, pins, or the like create a closed loop magnetic circuit that concentrates the flux density around the diaphragm traces and define an 'air-gap' within which the conductive traces of the diaphragm are arranged for improved efficiency.

Representatively, in one aspect, the disclosure is directed to a transducer assembly comprising: an air motion transformer having a magnet assembly operable to provide a magnetic field and a folded diaphragm having conductive traces and operable to expand or contract in a first direction and emit a sound in a second direction perpendicular to the first direction; and a ferromagnetic assembly comprising a number of fixed members arranged within folds of the folded diaphragm to provide a closed loop magnetic circuit that drives the expansion or contraction of the folded diaphragm. In some aspects, the number of fixed members are arranged within the folds to define an air gap for the conductive traces. In some aspects, the number of fixed members are arranged within the folds to improve a high frequency performance of the transducer assembly. In some aspects, at least one fixed member of the number of fixed members is arranged within each of the folds of the folded diaphragm. In some aspects, each fixed member of the number of fixed members includes a dimension selected to displace a volume of air within a respective fold and avoid contact with the folded diaphragm during expansion or contraction of the folded diaphragm. In some aspects, a first fixed member of the number of fixed members comprises a different cross-sectional shape than a second fixed member of the number of fixed members. In still further aspects, at least one fixed member of the number of fixed members comprises a ferromagnetic rod that extends entirely across a fold within which the steel rod is positioned. In some aspects, each fixed member of the number of fixed members comprises a length dimension at least as great as a length dimension of a respective fold within which the fixed member is positioned. In additional aspects, the number of fixed members are connected to a frame member that extends around a side of the magnet assembly opposite the folded diaphragm. The number of fixed members and the frame member may form a one piece ferromagnetic assembly made of steel. In still further aspects, the air motion transformer and the ferromagnetic assembly are coupled to a portable electronic device enclosure.

In another aspect, a portable electronic device is disclosed including an enclosure having an enclosure wall that defines an interior chamber and an acoustic opening to an ambient environment surrounding the enclosure wall; a transducer positioned within the interior chamber, the transducer having a magnet assembly and a corrugated diaphragm having conductive traces and operable to expand or contract in a first direction and emit a sound in a second direction perpendicular to the first direction; and a number of ferromagnetic members fixedly arranged within corrugations of the corrugated diaphragm to provide a closed loop magnetic circuit that drives the expansion or contraction of the corrugated diaphragm. In some aspects, the number of ferromagnetic members are arranged within the corrugations to define an air gap for the conductive traces. The number of ferromagnetic members may further be arranged within the corrugations to improve a high frequency performance of the transducer. In some aspects, at least one ferromagnetic member of the number of ferromagnetic members is arranged within each of the corrugations of the corrugated diaphragm. In still further aspects, each ferromagnetic member of the number of ferromagnetic members comprises a dimension selected to displace a volume of air within a respective corrugation and avoid contact with the corrugated diaphragm during expansion or contraction of the corrugated diaphragm. In some aspects, at least one ferromagnetic member of the number of ferromagnetic members comprises a different cross-sectional shape than at least one other ferromagnetic member. In some aspects, the number of ferromagnetic members comprise steel rods that extends entirely across corrugations within which the steel rods are positioned. In still further aspects, the number of ferromagnetic members are connected to a frame that extends around a side of the magnet assembly opposite the corrugated diaphragm. The number of ferromagnetic members and the frame may form a one-piece ferromagnetic assembly.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect in this disclosure are not necessarily to the same aspect, and they mean at least one.

FIG. 8 illustrates a side schematic view of one representative electronic device in which the AMT transducer assembly of FIGS. 1-7F may be implemented.

DETAILED DESCRIPTION

In this section we shall explain several preferred aspects of this disclosure with reference to the appended drawings. Whenever the shapes, relative positions and other aspects of the parts described are not clearly defined, the scope of the disclosure is not limited only to the parts shown, which are meant merely for the purpose of illustration. Also, while numerous details are set forth, it is understood that some aspects of the disclosure may be practiced without these details. In other instances, well-known structures and techniques have not been shown in detail so as not to obscure the understanding of this description.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

The terminology used herein is for the purpose of describing particular aspects only and is not intended to be limiting of the disclosure. Spatially relative terms, such as "beneath", "below", "lower", "above", "upper", and the like may be used herein for case of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly. In addition, a co-ordinate system is illustrated in each drawing for case of reference in which W represents the width direction, D represents the depth or thickness and L represents the length (or height) of the structure (e.g., the diaphragm).

Figure 1:
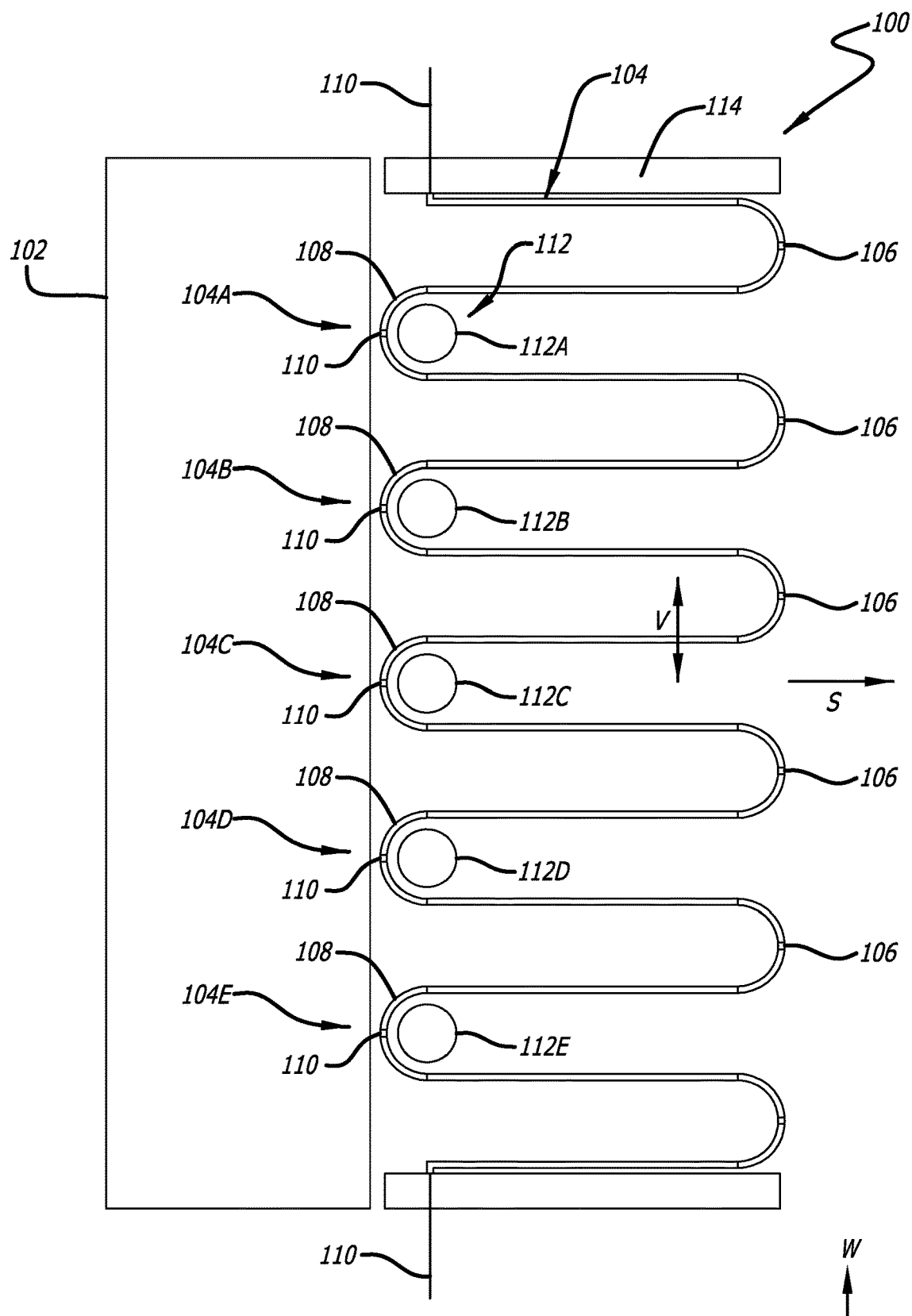
FIG. 1 illustrates a magnified cross-sectional end view of one aspect of an AMT transducer assembly including a closed loop magnetic circuit.

FIG. 1 illustrates a magnified cross-sectional end view of one aspect of an AMT transducer assembly including a closed loop magnetic circuit. Representatively, from this view, it can be seen that AMT transducer assembly 100 may include a magnet motor or assembly 102 and a moving mass, membrane or diaphragm 104 coupled to the assembly housing or enclosure 114. AMT transducer assembly 100 outputs sound in a direction of arrow (S) (e.g., a depth (D) direction) by moving or vibrating diaphragm 104 relative to the magnet assembly 102 in a direction of arrow (V) (e.g., a width (W) direction) as shown. Representatively, the magnet assembly 102 may include a hard magnetic material (e.g., permanent magnet) that provides a magnetic field. Diaphragm 104 may be arranged over the magnet assembly 102, and within the magnetic field. Diaphragm 104 may include a conductive wire, trace or member 110 attached to, formed on, or otherwise embedded within, a surface of diaphragm 104. Diaphragm 104 may further include a number of corrugations or folds 104A, 104B, 104C, 104D, 104E that allow for vibration in the direction of arrow (V). For example, folds 104A-E may be formed by a series of continuous ridges 106 and furrows 108 that together form folds 104A-E. These corrugations or folds move like an accordion and expand or contract in the direction of arrow (V). In some aspects, the conductive wire, trace or member 110 may be arranged to extend along each of the furrows 108 nearest the magnet assembly 102 as shown.

To close the magnetic circuit and increase the efficiency of the transducer assembly 100 as previously discussed, assembly 100 may further include a ferromagnetic assembly 112. Ferromagnetic assembly 112 may have any fixed arrangement relative to the magnet assembly 102. Ferromagnetic assembly 112 may be made of any type of ferromagnetic or soft magnetic material suitable for guiding flux lines of the magnetic field and closing the magnetic circuit of the assembly. Representatively, in one aspect, ferromagnetic assembly 112 may include a number of steel members 112A, 112B, 112C, 112D, 112E arranged within folds 104A-E of diaphragm 104. Representatively, in some aspects, steel members 112A-E may be elongated members such as bars, rods or the like which extend along an entire length of the respective folds 104A-E within which they are arranged. As can further be seen from this view, members 112A-E are arranged over the conductive members 110 within folds 104A-E and magnet assembly 102. In other words, the folds 104A-E and conductive members 110 are between the members 112A-E and magnet assembly 102. In this arrangement, members 112A-E operate to guide the flux lines of the magnetic field between the poles of the magnet assembly 102 to form a closed magnetic circuit with magnet assembly 102. In addition, fixed members 112A-E may form a defined air gap within which the flux lines are focused and the conductive member 110 is positioned for enhanced efficiency.

Figure 2:
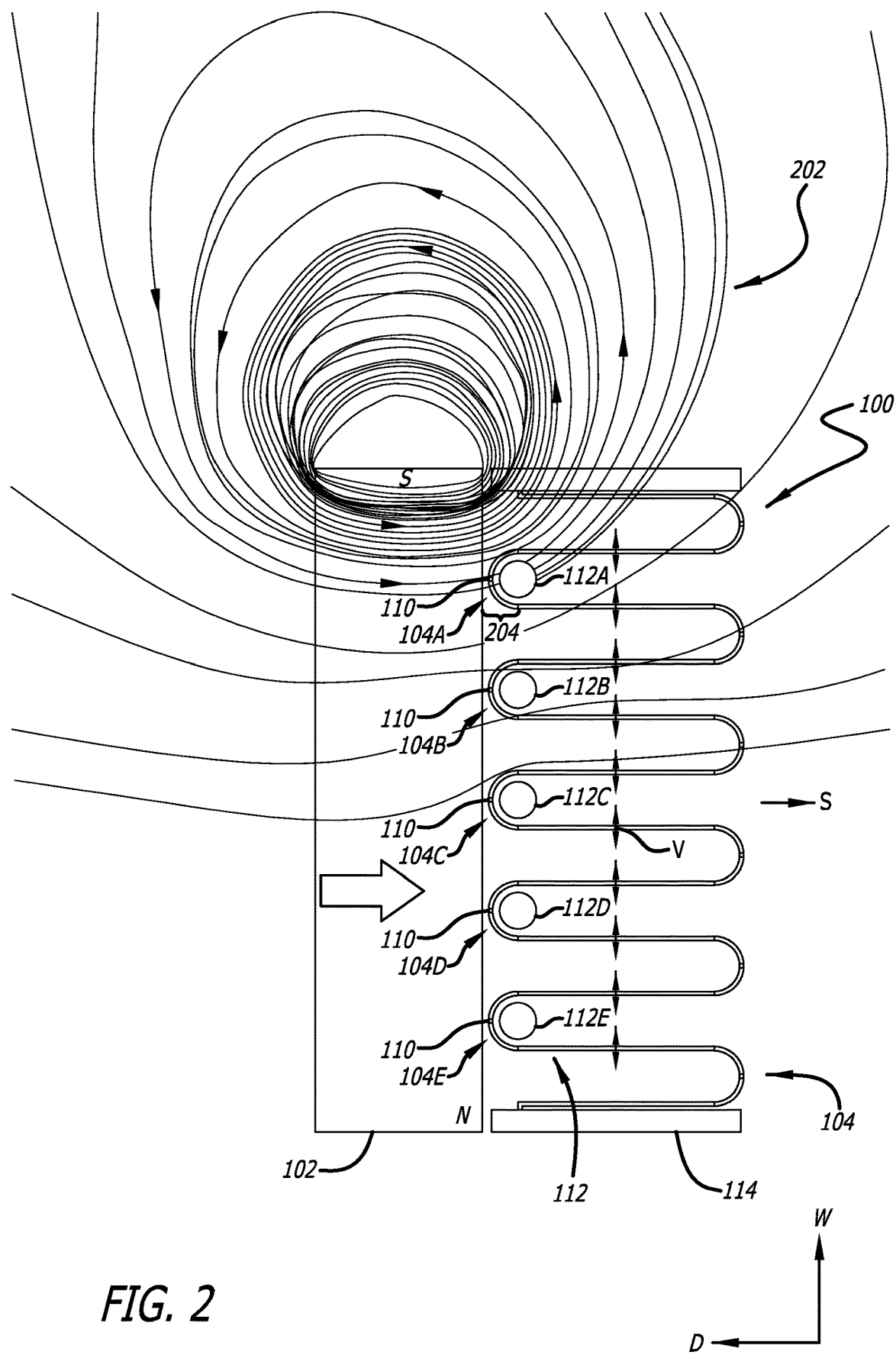
FIG. 2 illustrates a magnified cross-sectional end view of one aspect of an AMT transducer assembly including a closed loop magnetic circuit.

Representatively, FIG. 2 illustrates in more detail the air gap and concentration of magnetic flux lines created by the closed loop magnetic circuit described in reference to FIG. 1. In particular, as can be seen from FIG. 2, the flux lines 202 of the magnetic field are guided between the poles of magnet assembly 102 by members 112A-E. Flux lines 202 are therefore concentrated and/or more dense at the air gap 204 formed between member 112A-E and magnet assembly 102. The conductive members 110 within the folds 104A-E of diaphragm 104 are arranged in this rich magnetic field which, in turn, increases the efficiency of the transducer (e.g., increase in B in the efficiency equation). Representatively, upon application of a voltage or current (e.g., of a music signal), the current travels along the diaphragm 104 causing an opposing direction of the current flow along every fold 104A-E. The diaphragm 104 is arranged in the dense magnet field of the closed loop magnetic circuit as previously discussed and as a result of the Lorentz force in the opposing direction, the walls of each of folds 104A-E vibrate or move (e.g., expand or contract) in a direction of arrow (V), much like that of an accordion. This movement or vibration of folds 104A-E in the direction of arrow (V) moves the air mass within folds 104A-E in and out of the folds 104A-E in the direction of arrow (S).

Returning now to FIG. 1, members 112A-E may have a cross-sectional size and shape particularly selected to close the magnetic circuit as previously discussed, and to avoid interfering with the vibration of the folds 104A-E. In other words, the size of members 112A-E is selected to have a gap, spacing or clearance between members 112A-E and the surfaces of the diaphragm folds 104A-E within which they are positioned. In addition, the cross-sectional size and/or shape of members 112A-E may be selected to displace a portion of the air mass or load within folds 104A-E to further increase efficiency. Representatively, it may be understood that the air mass between folds 104A-E may increase and/or decrease depending on the depth of the folds 104A-E and/or the radiating surface area of diaphragm 104. The greater the air mass or load within folds 104A-E, the more adverse the impact will be on the high frequency performance of the transducer. Thus, in some aspects, the cross-sectional size and/or shape of members 112A-E may be selected or tuned to displace a desired amount of air within folds 104A-E, and in turn, reduce the air mass or load within folds 104A-E to increase transducer efficiency. The particular aspects of the size, shape and/or dimensions of members 112A-E will be described in more detail in reference to FIGS. 7A-7F.

Figure 3:
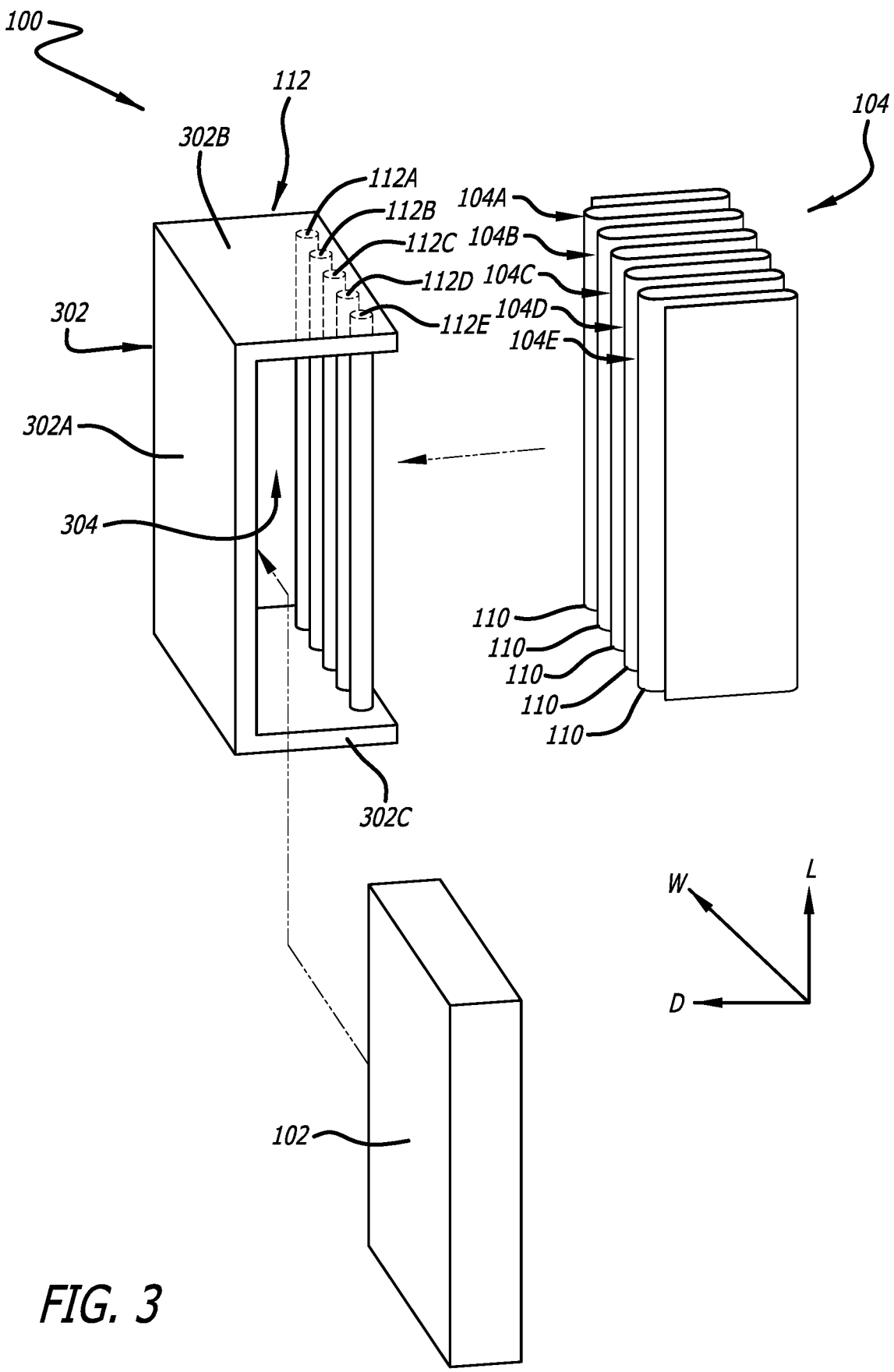
FIG. 3 illustrates an exploded perspective view of the AMT transducer assembly of FIGS. 1-2.

Referring now to FIG. 3, FIG. 3 illustrates an exploded perspective view of various aspects of the AMT transducer assembly 100 in more detail. Representatively, from this view, various aspects of magnet assembly 102, diaphragm 104 and ferromagnetic assembly 112 can be more easily understood. In particular, from this view, it can be seen that ferromagnetic assembly 112 includes a frame 302 and members 112A-E are assembled, connected, mounted or otherwise fixedly attached to frame 302. Representatively, frame 302 includes a base portion or wall 302A and side portions or walls 302B and 302C that are connected and extend perpendicular to base portion 302A. For example, frame 302 may be understood as forming a channel or U-shaped structure. Members 112A-E run across frame 302 parallel to wall 302A and are connected or otherwise attached along the free ends of walls 302B and 302C. In some aspects, members 112A-E and frame 302 may be a one-piece ferromagnetic assembly formed or otherwise made from a ferromagnetic material such as steel. Frame 302 along with members 112A-E extending across one end define a channel or cavity 304. Channel or cavity 304 may be dimensioned to hold or secure magnet assembly 102 so that magnet assembly 102 is positioned near members 112A-E arranged in folds 104A-E of diaphragm as previously discussed. In this aspect, ferromagnetic member 112 can envelope or otherwise be fixedly positioned around the magnet 102 and arranged within folds 104A-E of diaphragm 104 as shown in FIGS. 1-2.

Figure 4:
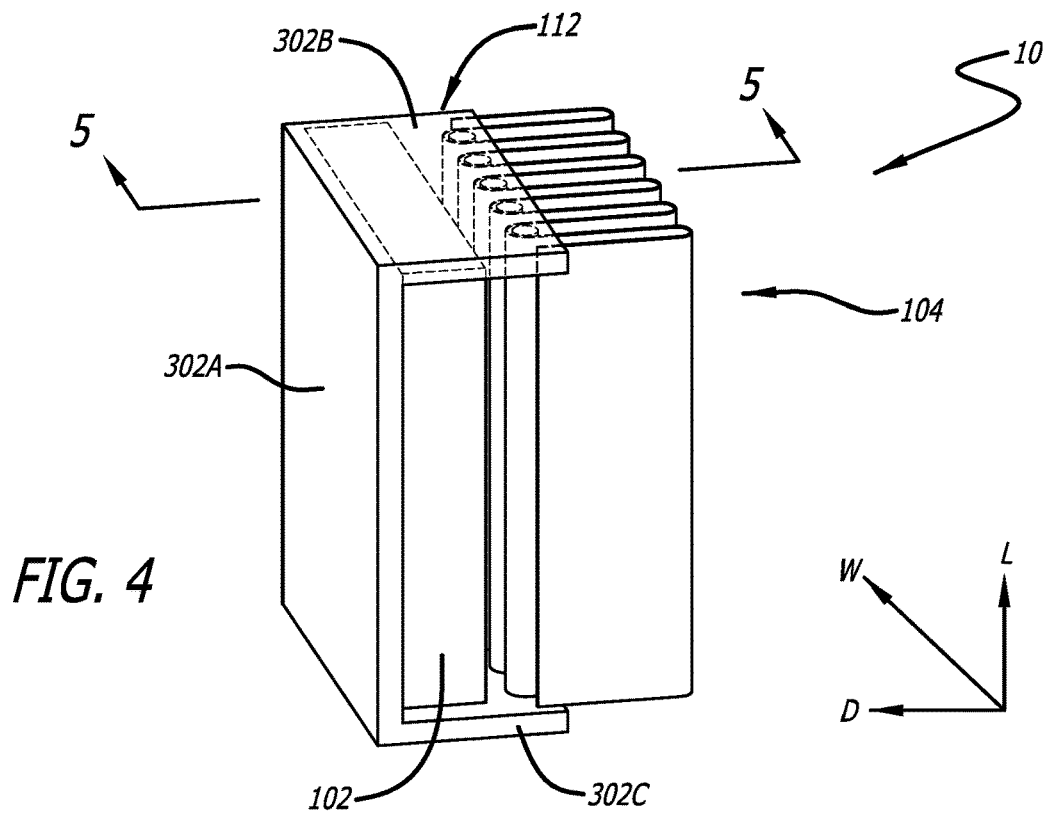
FIG. 4 illustrates an assembled perspective view of the AMT transducer assembly of FIGS. 1-3.

Representatively, as illustrated in the assembled view of FIG. 4, ferromagnetic members 112A-E of ferromagnetic member 112 are positioned within folds 104A-E of diaphragm 104. Walls 302A-C of ferromagnetic member 112 extend from the ends of members 112A-E below diaphragm 104. Magnet assembly 102 is then positioned within cavity 304 of frame 302 and aligned below ferromagnetic members 112A-E to complete the closed loop magnetic circuit and increase efficiency of transducer assembly 100.

Figure 5:
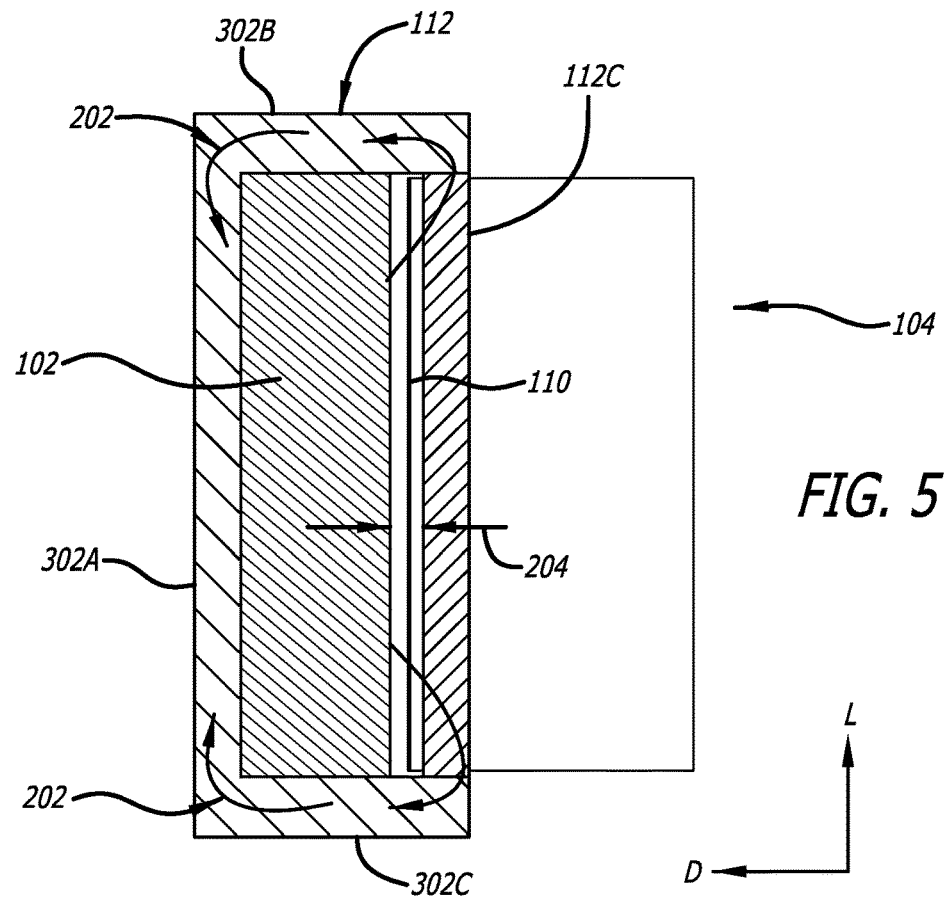
FIG. 5 illustrates a cross-sectional view of the AMT transducer assembly of FIG. 4 along line 5-5.

Referring now to FIG. 5, FIG. 5 is a cross-sectional side view along line 5-5' of FIG. 4. From this view, it can be more clearly understood how ferromagnetic member 112 envelopes or extends entirely around magnet assembly 102 from the top, bottom and sides, and along each of the folds 104A-E of diaphragm 104. It can further be understood from this view that ferromagnetic members 112A-E are continuous rods or elongated structures that extend the entire length dimension (L) of folds 104A-E of diaphragm 104. In addition, the ferromagnetic members 112A-E are spaced from the magnet assembly 102 as previously discussed to define the air gap 204. The conductive trace or wires 110 attached to diaphragm 104 are positioned in the air gap 204 as further shown. The closed loop magnetic circuit formed by the magnet assembly 102 and members 112A-E concentrates the magnetic field within the air gap 204 that wires 110 are positioned within, therefore further increasing the efficiency of the transducer.

Figure 6:
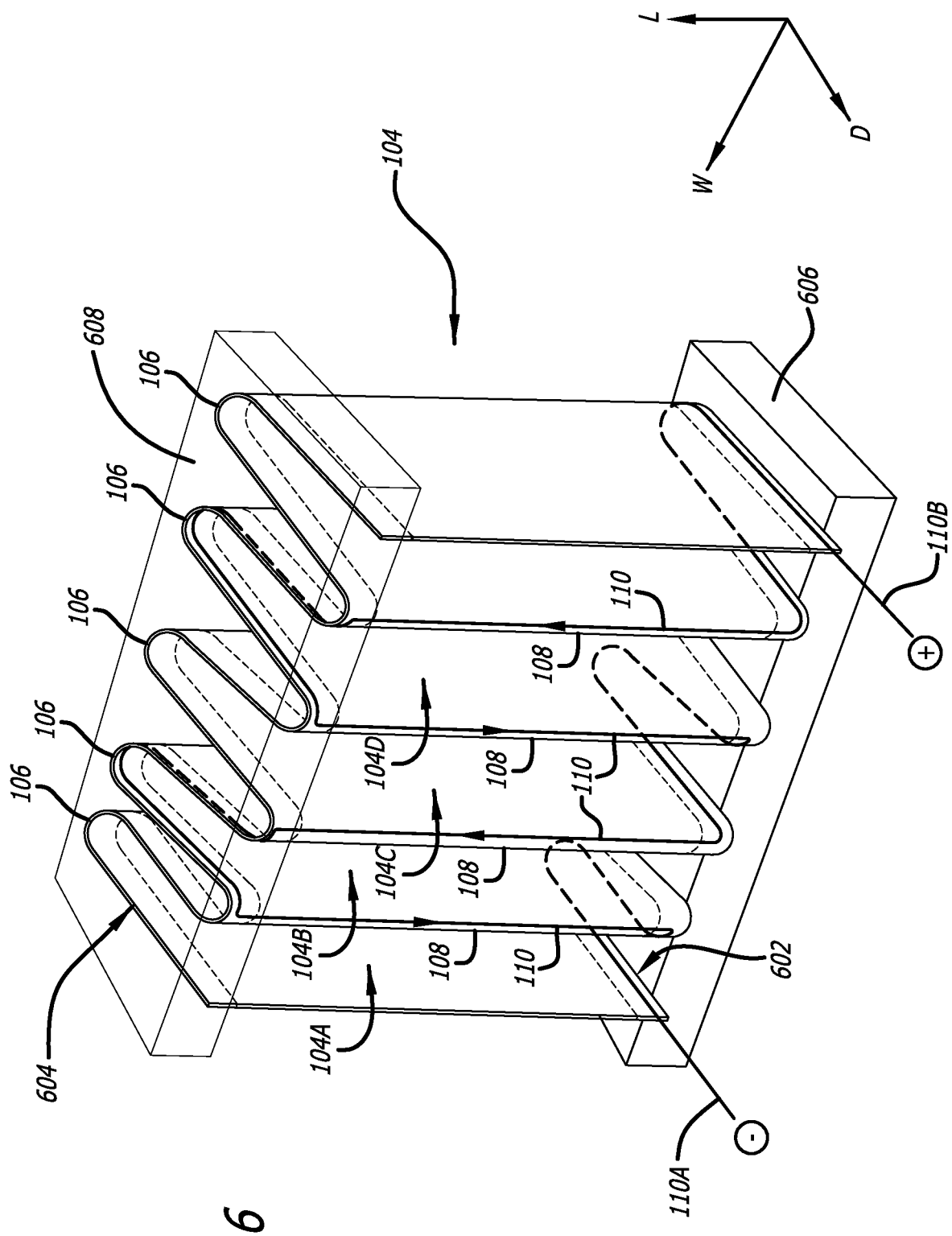
FIG. 6 illustrates a magnified perspective view of a membrane of the AMT transducer assembly of FIGS. 1-5.

One representative arrangement of the conductive traces or wires 110 along diaphragm 104 to ensure positioning within the air gap 204 is further illustrated in FIG. 6. Representatively, FIG. 6 illustrates a bottom perspective view of diaphragm 104 previously discussed in reference to FIGS. 1-5. From this view, it can be seen that conductive traces or wires 110 are a continuous conductive trace or wire that runs along the bottom or furrow 108 of each of folds 104A-E. The traces or wires 110 are connected between folds 104A-E by running them along the edges 602, 604 of diaphragm 104. The term "edge" or "edges" may be understood herein as referring to the ends or sides 602, 604 of diaphragm 104 defining the length dimension (L) of diaphragm 104. For example, one end of the conductive trace or wire 110A may start at fold 104A and run up edge 602 of the diaphragm to ridge 106, and then down edge 602 of fold 104A until it reaches the bottom of furrow 108. Trace or wire 110 then continues to run along furrow 108 of fold 104A until it reaches the other edge 604 of fold 104A. The conductive trace or wire 110 then runs up edge 604 of fold 104A toward ridge 106 until it reaches fold 104B. Conductive trace or wire 110 then continues and runs down the edge 604 of fold 104B until it reaches the bottom of furrow 108 of fold 104B, then runs along the furrow 108 until it reaches the other edges 602 of fold 104B, and then goes back up the edge 602 of fold 104B until it reaches the next fold 104C. Conductive trace or wire 110 continues to run up, down and along the remaining folds until it terminates at the opposite trace or wire end 110B. In addition, in some aspects, edges 602, 604 may be dipped, or otherwise embedded in, a compliant material 606, 608 to acoustically and/or mechanically seal the portions of trace or wire 110 that are not aligned within the air gap and used to drive the vibration or excursion of the diaphragm 104. It may further be appreciated that since the compliant material 606, 608 is not part of the radiating surface area of diaphragm 104, it will not adversely impact the efficiency of the transducer 100.

Returning now to additional aspects of the ferromagnetic member 112 selected for enhanced efficiency, FIGS. 7A-7F illustrate various sizes and dimensions of the members running along the folds of diaphragm 104 that can be selected to improve efficiency. Representatively, as previously discussed, the greater the air mass or load within folds of diaphragm 104, the more adverse the impact will be on the high frequency performance of the transducer. Thus, in some aspects, the cross-sectional size and/or shape of members 112 may be selected or tuned to displace a desired amount of air within folds of diaphragm 104, and in turn, reduce the air mass or load within folds 104 to increase transducer efficiency. Representatively, as can be understood from FIGS. 7A-F, each of the folds of diaphragm 104 may have a particular depth (D) and width (W) (and length (L) not shown). Member 112 positioned within the fold of diaphragm 104 may also have a depth, width and size suitable for avoiding interference with the fold of diaphragm 104 during vibration as well as to displace a desired air volume for enhanced efficiency.

Figure 7A:
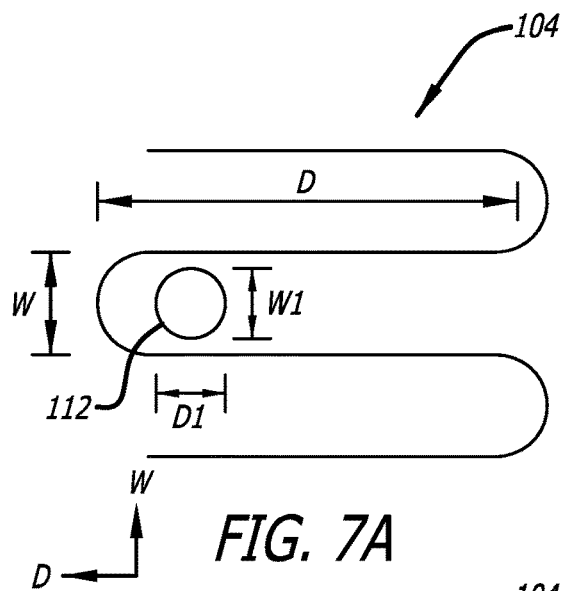
FIGS. 7A-7F illustrates magnified cross-sectional views of a portion of the assembly of FIGS. 1-6.

For example, as shown in FIG. 7A, member 112 may have a circular cross-sectional shape with a depth (D1) and width (W1) less than the depth (D) and width (W), respectively, of the fold of diaphragm 104. Member 112 may have the same shape, depth (D1) and width (W1) along its entire length and run the entire length of fold 104 as previously discussed. Member 112 therefore displaces a corresponding volume of air within the fold of diaphragm 104 occupied by member 112 and reduces the air mass or load within the fold of diaphragm 104 for improved efficiency.

Figure 7B:
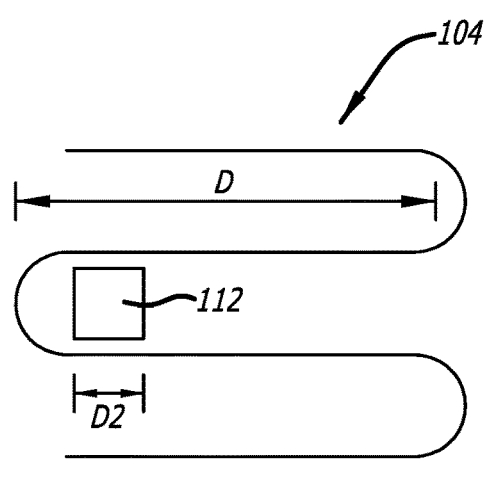

FIG. 7B illustrates another exemplary member 112 having a depth (D2) and width similar to that of the member 112 of FIG. 7A, however, in this aspect member 112 has a square cross-sectional shape. Member 112 may have the same shape, depth, and width along its entire length and run the entire length of the fold of diaphragm 104 as previously discussed to reduce the air mass or load as desired for improved efficiency.

Figure 7C:
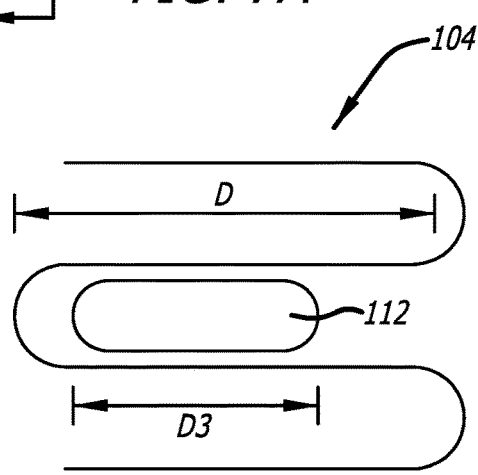

FIG. 7C illustrates a further exemplary member 112 having a width similar to that of member 112 of FIG. 7A (e.g., a width (W1)), however, the shape and depth are changed to displace a greater air volume. Representatively, member 112 of FIG. 7C has an elongated shape and an increased depth (D3) to displace a greater air volume. Representatively, depth (D3) may be greater than previously discussed depths (D2) and (D1) but still less than the depth (D) of the fold of diaphragm 104. Due to the elongated shape and greater surface area of member 112 of FIG. 7C, member 112 may displace a greater air volume or mass than the members 112 described in reference to FIGS. 7A-7B.

Figure 7D:
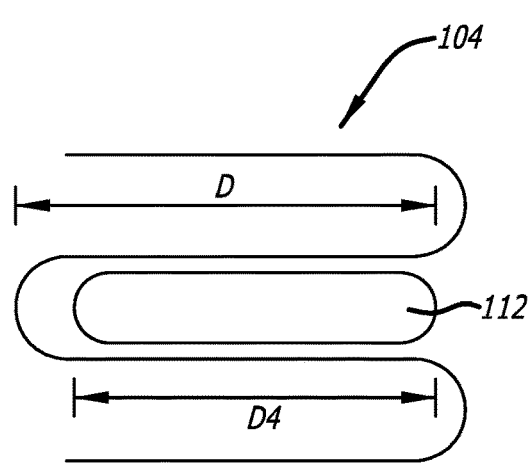

FIG. 7D illustrates a further exemplary member 112 having an elongated shape and a width similar to that of member 112 of FIG. 7C (e.g., a width (W1)), however, the depth is increased even more to displace an even greater air volume. Representatively, member 112 of FIG. 7D has an elongated shape and an increased depth (D4) that is greater than depth (D3) of member 112 of FIG. 7C, but still less than the depth (D) of the fold of diaphragm 104. In this aspect, member 112 of FIG. 7D will displace a greater volume of air than members 112 having the sizes/shapes described in reference to the previously discussed FIGS. 7A-7C.

Figure 7E:
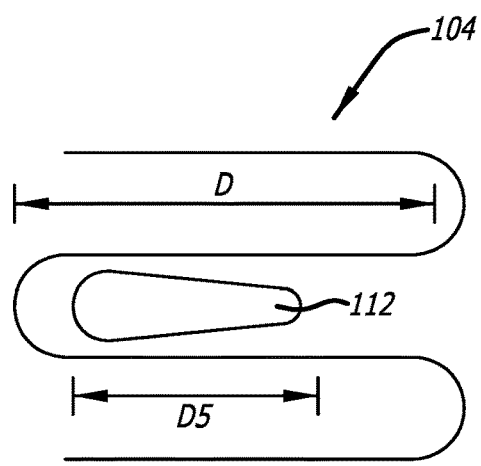

FIG. 7E illustrates a further exemplary member 112 having an elongated tear drop shaped member 112. Representatively, member 112 of FIG. 7E has an elongated shape with a width (W1) similar to that of the member 112 of FIG. 7A at one end, but then it tapers to a narrower with at the other end. Member 112 of FIG. 7E may further have a depth (D5) that is greater than depths (D1) and (D2) of the circular and shaped members described in reference to FIGS. 7A-7B, but less than the depth (D) of the fold of diaphragm 104.

Figure 7F:
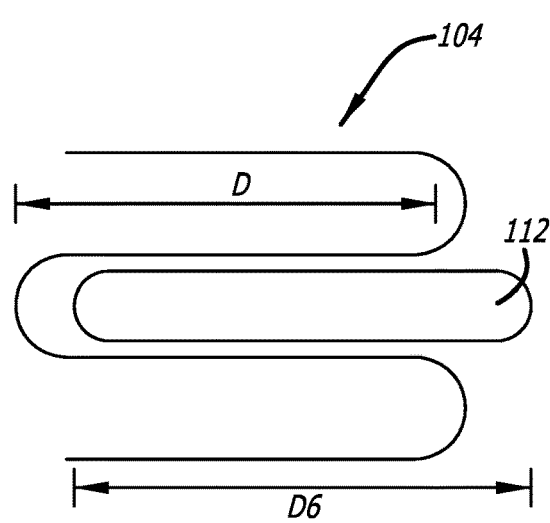

FIG. 7F illustrates another exemplary member 112 having an elongated shape and a width similar to that of members 112 of FIGS. 7C-7D (e.g., a width (W1)), however, the depth is increased even more to displace a greater air volume. Representatively, member 112 of FIG. 7F has an elongated shape and an increased depth (D6) that is greater than depth (D) of the fold of diaphragm 104. In this aspect, member 112 of FIG. 7F will displace a greater volume of air than members 112 having the sizes/shapes described in reference to the previously discussed FIGS. 7A-7E.

It should further be understood that while particular shapes, sizes and dimensions for members 112 are described and illustrated in reference to FIGS. 7A-7F, other shapes, sizes and dimensions are contemplated and can be used depending on the amount of air mass or load desired to be displaced. Aspects of the disclosure are therefore not intended to be limited to the particular members 112 shown in FIGS. 7A-7F. In addition, any one or more of the members 112A-112E previously discussed in reference to FIGS. 1-4 may have any one or more of the sizes, shapes and/or dimensions illustrated in FIGS. 7A-7F. For example, members 112A-112E may have any one or more of the same or different shapes, sizes and/or dimensions illustrated in FIGS. 7A-7F. Representatively, member 112A may have the shape/dimensions of member 112 of FIG. 7A, member 112B may have the shape/dimensions of member 112 of FIG. 7B, member 112C may have the shape/dimensions of member 112 of FIG. 7C, member 112D may have the shape/dimensions of member 112 of FIG. 7D, and member 112E may have the shape/dimension of member 112 of FIG. 7E. Thus, it should be understood from the disclosure that although not necessarily shown in combination in a drawing, any one or more of the configurations, aspects, components or elements illustrated in any one or more of FIGS. 1-7F may be mixed and matched and combined in any matter desired.

FIG. 8 illustrates a cross-sectional side view of one aspect of an assembly or device including a closed loop magnet circuit air motion transformer as described in reference to FIGS. 1-7F. The assembly or device 800 may include a housing, casing or outer enclosure 804 that defines or closes off a chamber in which the constituent electronic components of electronic assembly or device 800 are contained. In some aspects, it is contemplated that device 800 may be a portable or mobile device such as a portable speaker, a smart speaker, a computer, or a module implemented within a portable device, or any other device within which an AMT transducer may be implemented. Enclosure 802 may include an enclosure wall 804 that separates a surrounding environment 822 from an encased space or interior chamber 806 formed within enclosure 802. In some cases, the enclosure wall 804 completely isolates or seals the entire, or a portion of, interior chamber 806 from the surrounding environment 822. For example, the enclosure wall 804 may form a waterproof or acoustically isolated portion of interior chamber 806 which is impermeable to water and/or air. The interior chamber 806 may be of a sufficient volume and/or size to accommodate the constituent components of electronic device 800. The enclosure wall 804 may also include one or more of an acoustic opening or port 808. The acoustic opening or port 808 may be, for example, a sound output port through which sound from a transducer positioned within interior chamber 806 may be output to the ambient environment 822.

Representatively, in one aspect shown in FIG. 8, enclosure acoustic port 808 is an acoustic port that is acoustically open to AMT transducer assembly 100 positioned within interior chamber 806. AMT transducer assembly 100 may be, or may otherwise include, any one or more aspects of the transducer assembly 100 previously discussed in reference to FIGS. 1-7F. In some aspects, assembly 100 may be coupled to an interior wall 812 and be considered to divide interior chamber 806 into a front volume chamber 806A and a back volume chamber 806B around transducer assembly 800. In some aspects, front volume chamber 806A may form a chamber having a first volume (V1) around the sound output face or surface of transducer assembly 800. The front volume chamber 806A (and first volume V1) may be considered acoustically coupled to, or otherwise open to, acoustic port 808. In this aspect, sound pressure waves output from transducer assembly 100 may pass through front volume chamber 806A and out to the surrounding ambient environment 822 through acoustic port 808. Back volume chamber 806B may have a second volume (V2) and surround the back side of transducer assembly 100.

Figure 9:
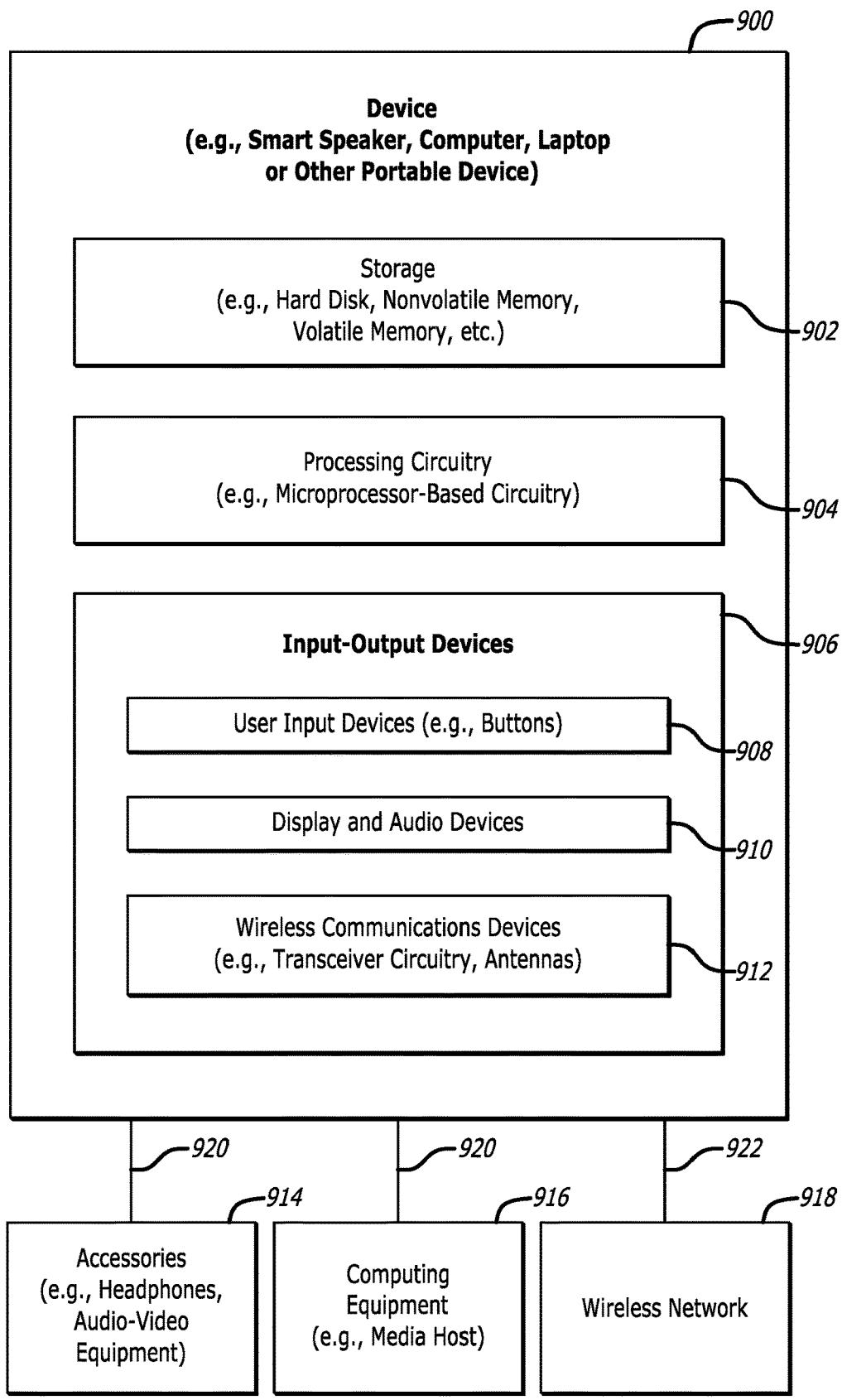
FIG. 9 illustrates a block diagram of one aspect of an electronic device within which the AMT transducer assembly of FIGS. 1-7F may be implemented.

FIG. 9 illustrates a block diagram of one aspect of an electronic device within which the previously discussed AMT transducer assembly may be implemented. As shown in FIG. 9, device 900 may be any type of device within which an AMT transducer assembly disclosed herein may be desired, for example, a smart speaker, a portable speaker, a computer, a laptop or other portable electronic device. Device 900 may include storage 902. Storage 902 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 904 may be used to control the operation of device 900. Processing circuitry 904 may be based on a processor such as a microprocessor and other suitable integrated circuits. With one suitable arrangement, processing circuitry 904 and storage 902 are used to run software on device 900, such as internet browsing applications, voice-over-internet-protocol (VOIP) telephone call applications, email applications, media playback applications, operating system functions, etc. Processing circuitry 904 and storage 902 may be used in implementing suitable communications protocols. Communications protocols that may be implemented using processing circuitry 904 and storage 902 include internet protocols, wireless local area network protocols (e.g., IEEE 802.11 protocols—sometimes referred to as Wi-Fi®), protocols for other short-range wireless communications links such as the Bluetooth® protocol, protocols for handling 3G or 4G communications services (e.g., using wide band code division multiple access techniques), 2G cellular telephone communications protocols, etc.

To minimize power consumption, processing circuitry 904 may include power management circuitry to implement power management functions. For example, processing circuitry 904 may be used to adjust the gain settings of amplifiers (e.g., radio-frequency power amplifier circuitry) on device 900. Processing circuitry 904 may also be used to adjust the power supply voltages that are provided to portions of the circuitry on device 900. For example, higher direct-current (DC) power supply voltages may be supplied to active circuits and lower DC power supply voltages may be supplied to circuits that are less active or that are inactive. If desired, processing circuitry 904 may be used to implement a control scheme in which the power amplifier circuitry is adjusted to accommodate transmission power level requests received from a wireless network.

Input-output devices 906 may be used to allow data to be supplied to device 900 and to allow data to be provided from device 900 to external devices. Display screens, microphone acoustic ports, speaker acoustic ports, and docking ports are examples of input-output devices 906. For example, input-output devices 906 can include user input-output devices 908 such as buttons, touch screens, joysticks, click wheels, scrolling wheels, touch pads, keypads, keyboards, microphones, cameras, etc. A user can control the operation of device 900 by supplying commands through user input devices 908. Display and audio devices 910 may include liquid-crystal display (LCD) screens or other screens, lightemitting diodes (LEDs), and other components that present visual information and status data. Display and audio devices 910 may also include audio equipment such as speakers and other devices for creating sound. Display and audio devices 910 may contain audio-video interface equipment such as jacks and other connectors for external headphones and monitors.

Wireless communications devices 912 may include communications circuitry such as radiofrequency (RF) transceiver circuitry formed from one or more integrated circuits, power amplifier circuitry, passive RF components, antennas, and other circuitry for handling RF wireless signals. Wireless signals can also be sent using light (e.g., using infrared communications). Representatively, in the case of a speaker acoustic port, the speaker may be associated with the port and be in communication with an RF antenna for transmission of signals from the far end user to the speaker.

Returning to FIG. 9, device 900 can communicate with external devices such as accessories 914, computing equipment 916, and wireless network 918 as shown by paths 920 and 922. Paths 920 may include wired and wireless paths. Path 922 may be a wireless path. Accessories 914 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 916 may be any suitable computer. With one suitable arrangement, computing equipment 916 is a computer that has an associated wireless access point (router) or an internal or external wireless card that establishes a wireless connection with device 900. The computer may be a server (e.g., an internet server), a local area network computer with or without internet access, a user's own personal computer, a peer device (e.g., another portable electronic device), or any other suitable computing equipment.

Wireless network 918 may include any suitable network equipment, such as cellular telephone base stations, cellular towers, wireless data networks, computers associated with wireless networks, etc. For example, wireless network 918 may include network management equipment that monitors the wireless signal strength of the wireless handsets (cellular telephones, handheld computing devices, etc.) that are in communication with network 918.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting. Representatively, although not necessarily shown in combination in a drawing, any one or more of the configurations, aspects, components or elements illustrated in any one or more of FIGS. 1-9 may be mixed and matched and combined in any matter desired. Moreover, although a portable electronic device such as a portable speaker and/or a smart speaker is described herein, the transducer assembly may be implemented within a tablet computer, personal computer, laptop computer, notebook computer, headphones or any other type of portable electronic device. In addition, to aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. A transducer assembly comprising:
an air motion transformer having a magnet assembly operable to provide a magnetic field and a folded diaphragm having conductive traces and operable to expand or contract in a first direction and emit a sound in a second direction perpendicular to the first direction; and
a ferromagnetic assembly comprising a number of fixed members arranged within folds of the folded diaphragm.

2. The transducer assembly of claim 1 wherein the number of fixed members are arranged within the folds to define an air gap for the conductive traces.

3. The transducer assembly of claim 1 wherein the number of fixed members are arranged within the folds to provide a closed loop magnetic circuit that drives expansion or contraction of the folded diaphragm.

4. The transducer assembly of claim 1 wherein at least one fixed member of the number of fixed members is arranged within each of the folds of the folded diaphragm.

5. The transducer assembly of claim 1 wherein each fixed member of the number of fixed members comprises a dimension selected to displace a volume of air within a respective fold and avoid contact with the folded diaphragm during expansion or contraction of the folded diaphragm.

6. The transducer assembly of claim 1 wherein a first fixed member of the number of fixed members comprises a different cross-sectional shape than a second fixed member of the number of fixed members.

7. The transducer assembly of claim 1 wherein at least one fixed member of the number of fixed members comprises a ferromagnetic rod that extends entirely across a fold within which the ferromagnetic rod is positioned.

8. The transducer assembly of claim 1 wherein each fixed member of the number of fixed members comprises a length dimension at least as great as a length dimension of a respective fold within which the fixed member is positioned.

9. The transducer assembly of claim 1 wherein the number of fixed members are connected to a frame member that extends around a side of the magnet assembly opposite the folded diaphragm.

10. The transducer assembly of claim 9 wherein the number of fixed members and the frame member form a one-piece ferromagnetic assembly made of steel.

11. The transducer assembly of claim 1 wherein the air motion transformer and the ferromagnetic assembly are coupled to a portable electronic device enclosure.

12. A portable electronic device comprising:
an enclosure having an enclosure wall that defines an interior chamber and an acoustic opening to an ambient environment surrounding the enclosure wall;
a transducer positioned within the interior chamber, the transducer having a magnet assembly and a corrugated diaphragm having conductive traces and operable to expand or contract in a first direction and emit a sound in a second direction perpendicular to the first direction; and
a number of ferromagnetic members fixedly arranged within corrugations of the corrugated diaphragm to provide a closed loop magnetic circuit that drives expansion or contraction of the corrugated diaphragm.

13. The portable electronic device of claim 12 wherein the number of ferromagnetic members are arranged within the corrugations to define an air gap for the conductive traces.

14. The portable electronic device of claim 12 wherein the number of ferromagnetic members are arranged within the corrugations to improve a high frequency performance of the transducer.

15. The portable electronic device of claim 12 wherein at least one ferromagnetic member of the number of ferromagnetic members is arranged within each of the corrugations of the corrugated diaphragm.

16. The portable electronic device of claim 12 wherein each ferromagnetic member of the number of ferromagnetic members comprises a dimension selected to displace a volume of air within a respective corrugation and avoid contact with the corrugated diaphragm during expansion or contraction of the corrugated diaphragm.

17. The portable electronic device of claim 12 wherein at least one ferromagnetic member of the number of ferromagnetic members comprises a different cross-sectional shape than at least one other ferromagnetic member.

18. The portable electronic device of claim 12 wherein the number of ferromagnetic members comprise steel rods that extends entirely across corrugations within which the steel rods are positioned.

19. The portable electronic device of claim 12 wherein the number of ferromagnetic members are connected to a frame that extends around a side of the magnet assembly opposite the corrugated diaphragm.

20. The portable electronic device of claim 19 wherein the number of ferromagnetic members and the frame form a one-piece ferromagnetic assembly.

* * * * *